United States Patent [19]
Hornbeck

[11] Patent Number: 5,021,663
[45] Date of Patent: Jun. 4, 1991

[54] INFRARED DETECTOR

[75] Inventor: Larry J. Hornbeck, Van Alstyne, Tex.

[73] Assignee: Texas Instruments Incorporated, Dallas, Tex.

[21] Appl. No.: 597,280

[22] Filed: Oct. 15, 1990

Related U.S. Application Data

[63] Continuation of Ser. No. 231,797, Aug. 12, 1988, abandoned.

[51] Int. Cl.$^5$ ............................ G01J 5/20; G01J 5/22; G01J 5/02
[52] U.S. Cl. ............................... 250/349; 250/338.1; 250/338.4; 250/370.01; 250/342
[58] Field of Search ............... 250/338.1, 338.2, 338.3, 250/338.4, 332, 370.08, 370.01, 330, 342, 349

[56] References Cited

U.S. PATENT DOCUMENTS

| | | | |
|---|---|---|---|
| 3,480,777 | 11/1969 | Astheimer | 250/338.3 |
| 4,051,374 | 9/1977 | Drexhage et al. | 250/370.08 |
| 4,142,207 | 2/1979 | McCormack et al. | 250/332 |
| 4,300,047 | 11/1981 | Fujii et al. | 250/338.3 |
| 4,346,291 | 8/1982 | Chapel, Jr. et al. | 250/338.4 |
| 4,348,611 | 9/1982 | Ruppel et al. | 250/211 R |
| 4,377,232 | 4/1983 | Hopper | 250/332 |
| 4,379,971 | 4/1983 | Smith et al. | 250/338.3 |
| 4,686,373 | 8/1987 | Few et al. | 250/578 |
| 4,710,732 | 12/1987 | Hornbeck | 332/7.51 |
| 4,754,139 | 6/1988 | Ennulat et al. | 250/332 |

FOREIGN PATENT DOCUMENTS 272731 1/1987 European Pat. Off. .

OTHER PUBLICATIONS

G. Lahiji et al.; A Monolithic Thermopile Detector Fabricated Using Integrated-Circuit Technology, 1980 IEEE.
International Conference on Solid-State Sensors and Actuators; 1985, pp. 132-135, IEEE, N.Y.; U.S.: Choi, I. H. et al. "A Linear Thermopile Infrared Detector Array with On-Chip Multiplexing".
Applied Optics, vol. 23; No. 6, Mar. 1984, pp. 910-914. N.Y., U.S.: Downey, P. M. et al., "Molithic Silicon Bolometers".
International Electron Devices Meeting, Washington, D.C.; 1985 pp. 436-439, IEEE, N.Y., U.S.: Ito, H. et al. "A-Si: H TFT Array Driven Linear Image Sensor with Capacitance . . . ".
Patent Abstracts of Japan, vol. 12; No. 314 Aug. 25, 1988, (E-649)[3161]: JP-A-63 78 581 (Fujitsu) Aug. 4, 1988.
Liddiard, "Thin-Film Resistance Bolometer . . . ", 24 Infrared Phys. 57 (1984).
Liddiard, "Thin-Film Resistance Bolometer IR Detectors-II", 26 Infrared Phys. 43 (1986).

Primary Examiner—Constantine Hannaher
Assistant Examiner—Jacob M. Eisenberg
Attorney, Agent, or Firm—James C. Kesterson; James T. Comfort; Melvin Sharp

[57] ABSTRACT

Preferred embodiments include a monolithic uncooled infrared detector array of bolometers fabricated over a silicon substrate (142); the bolometers include a stack (144) of oxide (146) TiN (148), a-Si:H (150), TiN (152), oxide (154) with the TiN forming the infrared absorbers and resistor contacts and the a-Si:H the resistor with a high temperature coefficient of resistivity. The resistor is suspended over the silicon substrate (142) by metal interconnects (154 and 156) and related processing circuitry is formed in the silicon substrate (142) beneath the resistor.

31 Claims, 12 Drawing Sheets

INFRARED DETECTOR

This application is a continuation of application Ser. No. 07/231,797, filed Aug. 12, 1988, now abandoned.

BACKGROUND OF THE INVENTION

1. Field of the Invention

The present invention relates to infrared-radiation detectors, and, more particularly, to uncooled bolometers for detection of infrared radiation.

2. Description of the Related Art

Detection of infrared radiation emitted by warm bodies provides an important method for night vision (perception without visible light). Infrared detectors may be classified in various ways, such as scanning or staring arrays, cryogenic (typically liquid nitrogen temperatures) or uncooled detectors, 3–5 micron or 8–12 micron spectral sensitivity range, and photon or thermal detection mechanism. Cryogenic infrared detectors are typically made of small bandgap (about 0.1–0.2 eV) semiconductors such as HgCdTe and operate as photodiodes or photocapacitors by photon absorption to produce electron-hole pairs. For example, see U.S. Pat. No. 4,686,373 (Tew et al) which describes a hybrid system with HgCdTe photocapacitors glued to silicon signal processing circuitry.

Uncooled infrared detectors cannot make use of small bandgap semiconductors because the bandgap is only about 4kT at room temperature and dark current swamps any signal. Consequently, uncooled infrared detectors rely on the other physical phenomena and are less sensitive than cryogenic detectors but do not require cooling apparatus or its energy consumption. For portable, low power applications where the greater detectivity of cryogenic detectors is not needed, the preferred choice is an uncooled thermal detector: infrared photons are absorbed and the resultant heating of the absorbing element is detected. The thermal detector is usually one of three types: (1) pyroelectric detector, (2) thermocouple, or (3) bolometer.

The pyroelectric detector uses a ferroelectric ceramic material (such as $BaSrTiO_3$) at operating temperatures (typically 0 C. to 150 C.) a little below its Curie temperature. The preferred ferroelectric materials have a large change in spontaneous dielectric polarization at operating temperatures, and the heating of the ferroelectric is detected by sensing the induced voltage created by the generation of charge across a capacitor with the ferroelectric as insulator. For example, see U.S. Pat. Nos. 4,348,611 (Ruppel et al), 4,142,207 (McCormack et al), and 4,379,232 (Hopper).

The pyroelectric detector is a hybrid approach that has problems when extended to large detector arrays (arrays of 256 by 256 pixels) due to ferroelectric material defects, contact defects, and bump bonding defects which imply low yields.

Thermocouples rely on the change in contact potential of a junction of dissimilar conductors with temperature; see for example G. Lahiji et al, A Monolithic Thermopile Detector Fabricated Using Integrated-Circuit Technology, 1980 IEEE IEDM Tech.Dig. 676 which uses bismuthantimony or polysilicon-gold couples in monolithic arrays on silicon.

Bolometers typically rely on the temperature change of resistance of thermally isolated thin metal films or semiconductor films. The thin films may be fabricated on a suspended dielectric film in a silicon substrate and may be located adjacent to monolithic detection circuitry on the silicon substrate. The dielectric film is thermally isolated from the remainder of the silicon substrate by etching away the silicon from beneath the dielectric film so that it is suspended. See for example K. C. Liddiard, 24 Infrared Physics 57 (1984) and 26 Infrared Physics 43 (1986) which includes amorphous silicon films for resistance change with temperature plus abutting nickel films for infrared absorption and electrical contact. The foregoing references are hereby incorporated by reference.

Thermocouples and bolometers avoid the yield problem of the pyroelectric detectors because they can be monolithically fabricated on a silicon wafer along with the detection circuitry. However, thermocouples and bolometers have the problem of lower detectivities than pyroelectric detectors.

SUMMARY OF THE INVENTION

The present invention provides infrared radiation imagers in the form of a monolithic array of bolometers with a high fill factor geometry together with high sensitivity resistance material. Preferred embodiments use doped, hydrogenated amorphous silicon (a-Si:H) coated with an infrared absorber as the resistance material and an architecture suspending the resistance material over silicon detection circuitry. The distance between the suspended resistance material and the underlying reflective substrate is one-quarter of the wavelength of the center of the infrared spectral band and provides enhanced infrared absorption.

This overcomes the problems of the known uncooled thermal detectors by achieving detectivity comparable to pyroelectric detectors while retaining the monolithic fabrication advantages of bolometers.

BRIEF DESCRIPTION OF THE DRAWINGS

The drawings are schematic for clarity.

DESCRIPTION OF THE PREFERRED EMBODIMENTS

Figure 1:
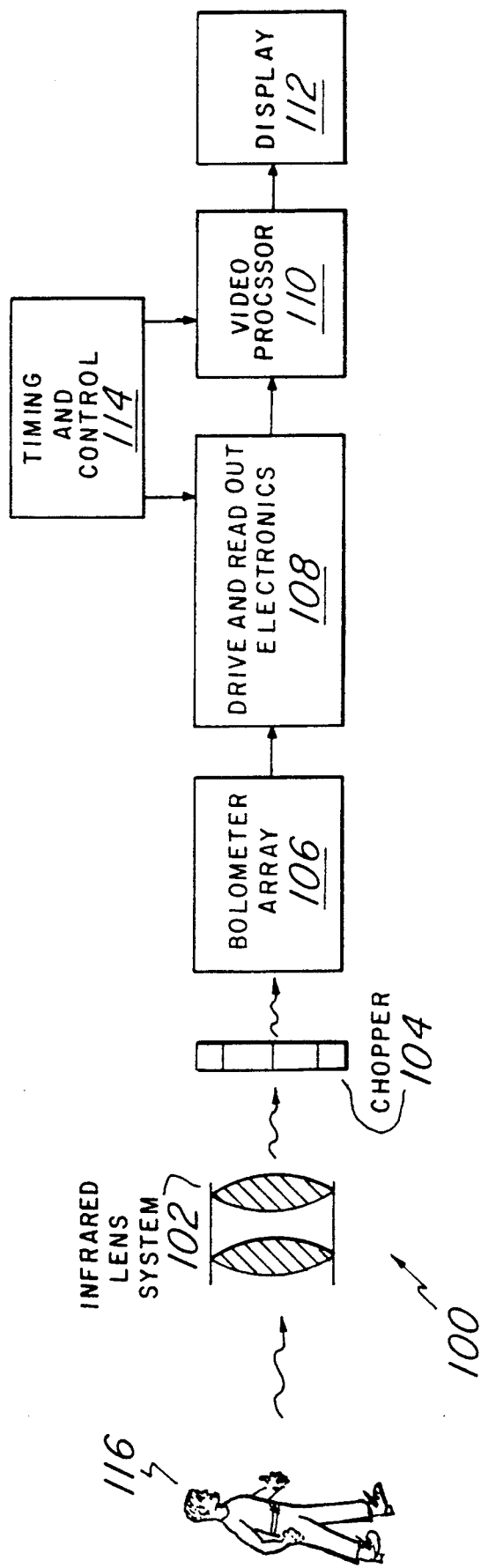
FIG. 1 shows a block diagram of an infrared detector system which includes a first preferred embodiment bolometer array.

FIG. 1 illustrates in schematic block diagram view an infrared imager system, generally denoted 100, which includes infrared lens system 102, mechanical chopper 104, bolometer array 106, drive and read out electronics 108 for array 106, video processor 110, display 112, and timing and control electronics 114. Lens system 102 images infrared radiation emitted by warm object 116 onto array 106. Chopper 104 may be a rotating disk with openings that periodically block and let pass the infrared radiation collected by lens system 102. Array 106 includes 64,536 bolometers arranged into 256 rows by 256 columns; each bolometer corresponds to a pixel in the image of warm body 116 plus surrounding scene in the field of view of lens system 102. Array 106 is housed in a stainless vacuum chamber with an infrared transparent window formed in one side. The window is positioned so that radiation from the scene with warm body 116 passes through the window onto array 106.

Figure 2:
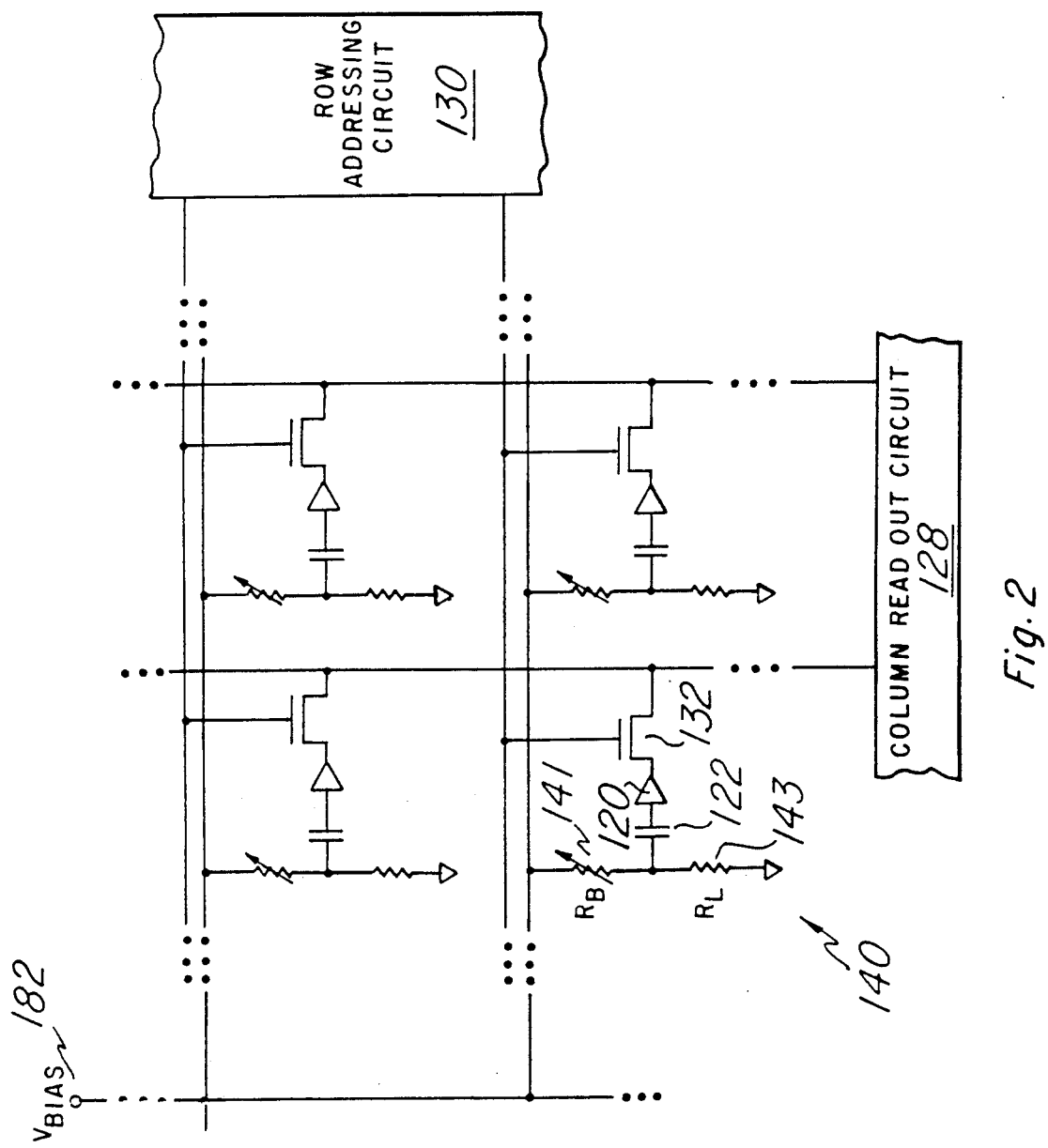
FIG. 2 is a plan view of a first preferred embodiment array.

FIG. 2 schematically illustrates in plan view a portion (four bolometers) of array 106 with thermally isolated resistor 141 that has a resistance $R_B$ that varies with temperature and is connected between grounded fixed load resistor 143 with resistance $R_L$ and fixed bias voltage $V_O$.

Figure 3:
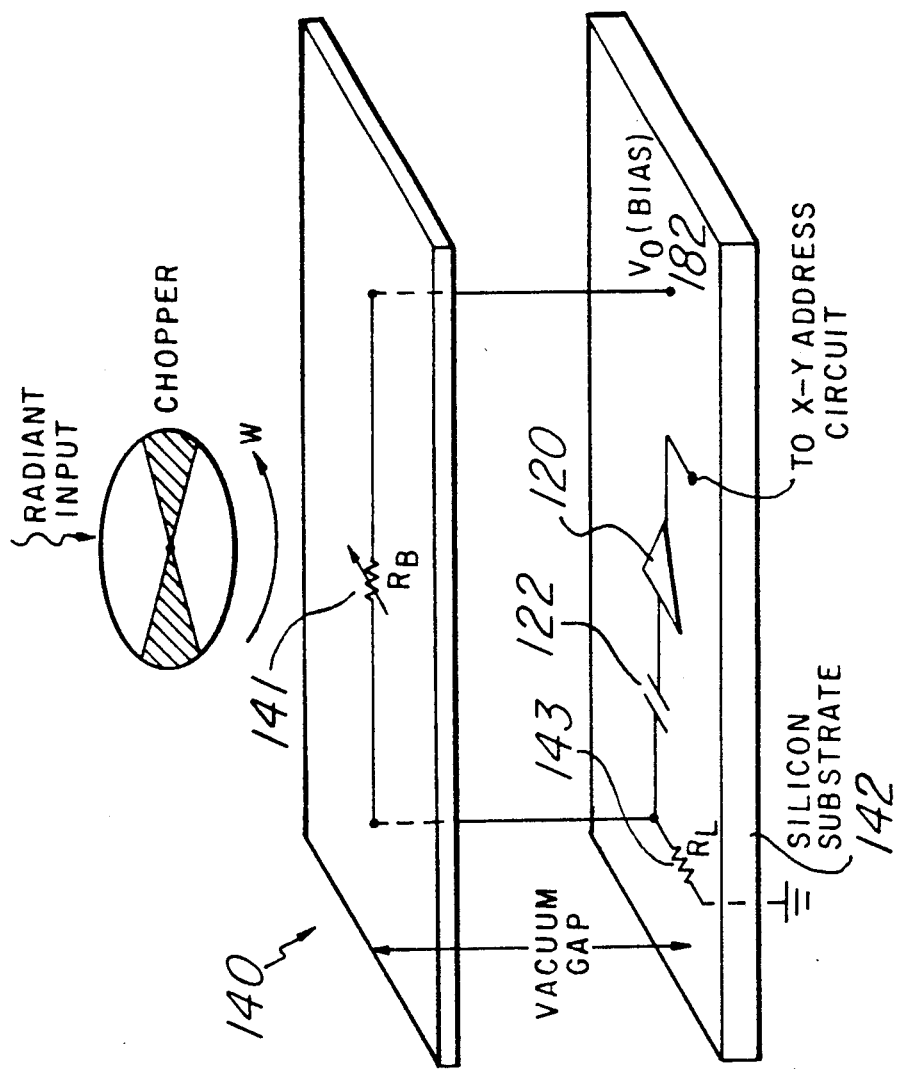
FIG. 3 is a perspective view of a single bolometer of the first preferred embodiment array.

FIG. 3 is a schematic perspective view of a single bolometer, generally denoted by reference numeral 140, from array 106. The operation of array 106 is as follows: The chopped scene including warm body 116 is imaged onto array 106 which causes each $R_B$ to fluctuate in value (with magnitude proportional to the temperature of the corresponding portion of the scene); the fluctuating value of $R_B$ yields an alternating voltage across load resistor 143 which is fed to buffer amplifier 120 through capacitor 122. The outputs of buffer amplifiers 120 are read in column read out circuit 128 with a row at a time selected by row addressing circuit 130 which turns on pass transistors 132 in one row at a time.

Figure 4A:
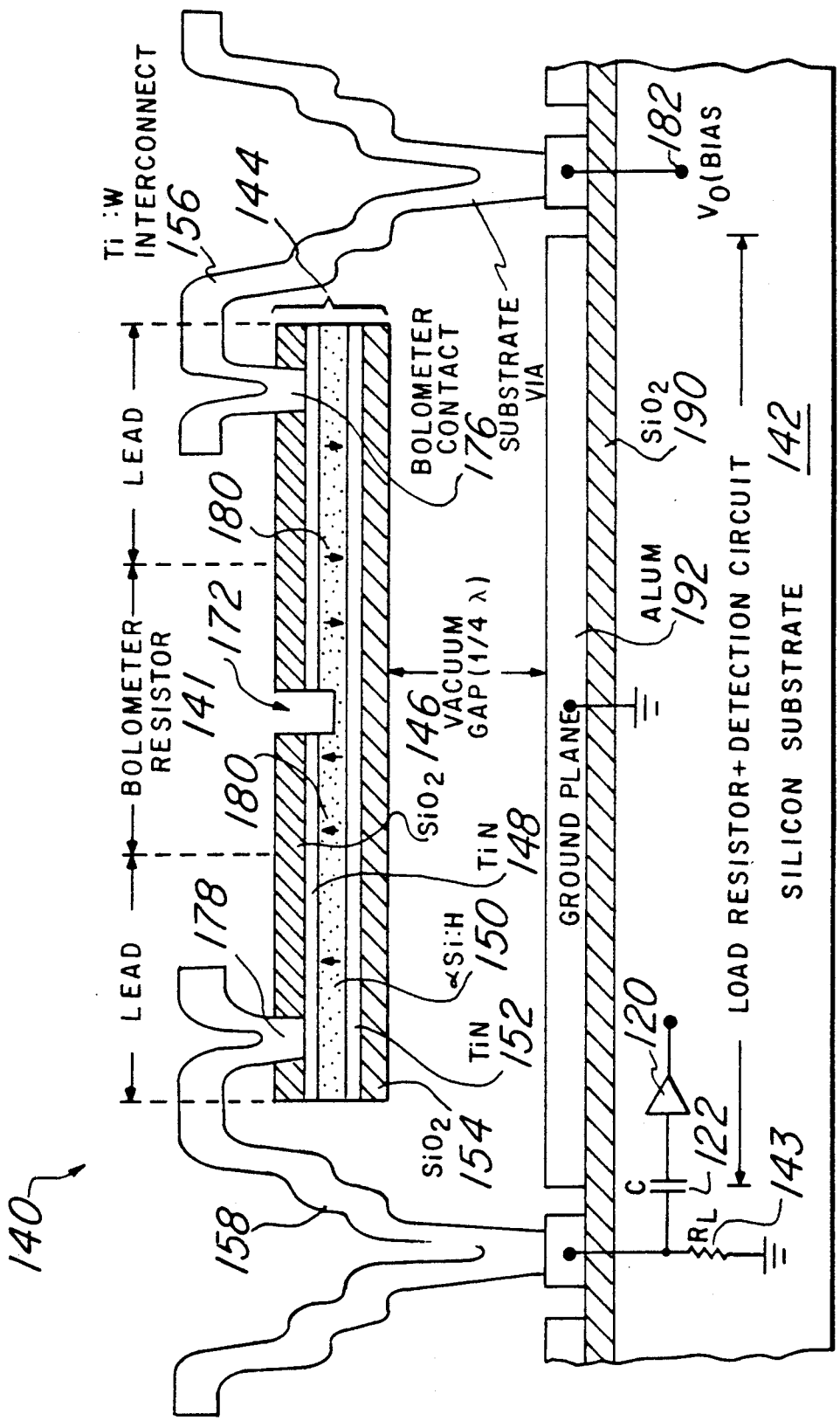
FIGS. 4a–b are cross sectional elevation views of a single bolometer of the first preferred embodiment array.
Figure 4B:
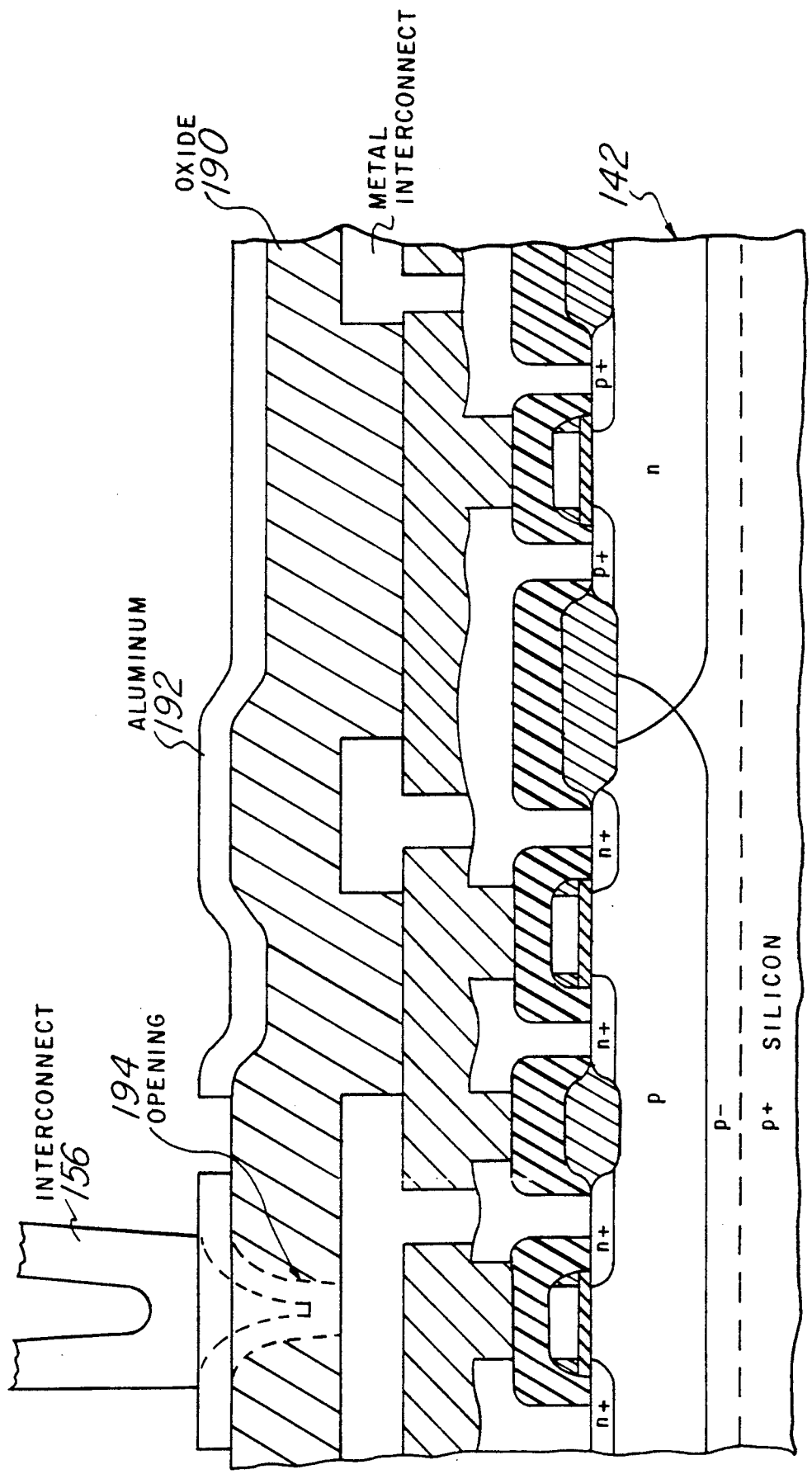
Figure 5A:
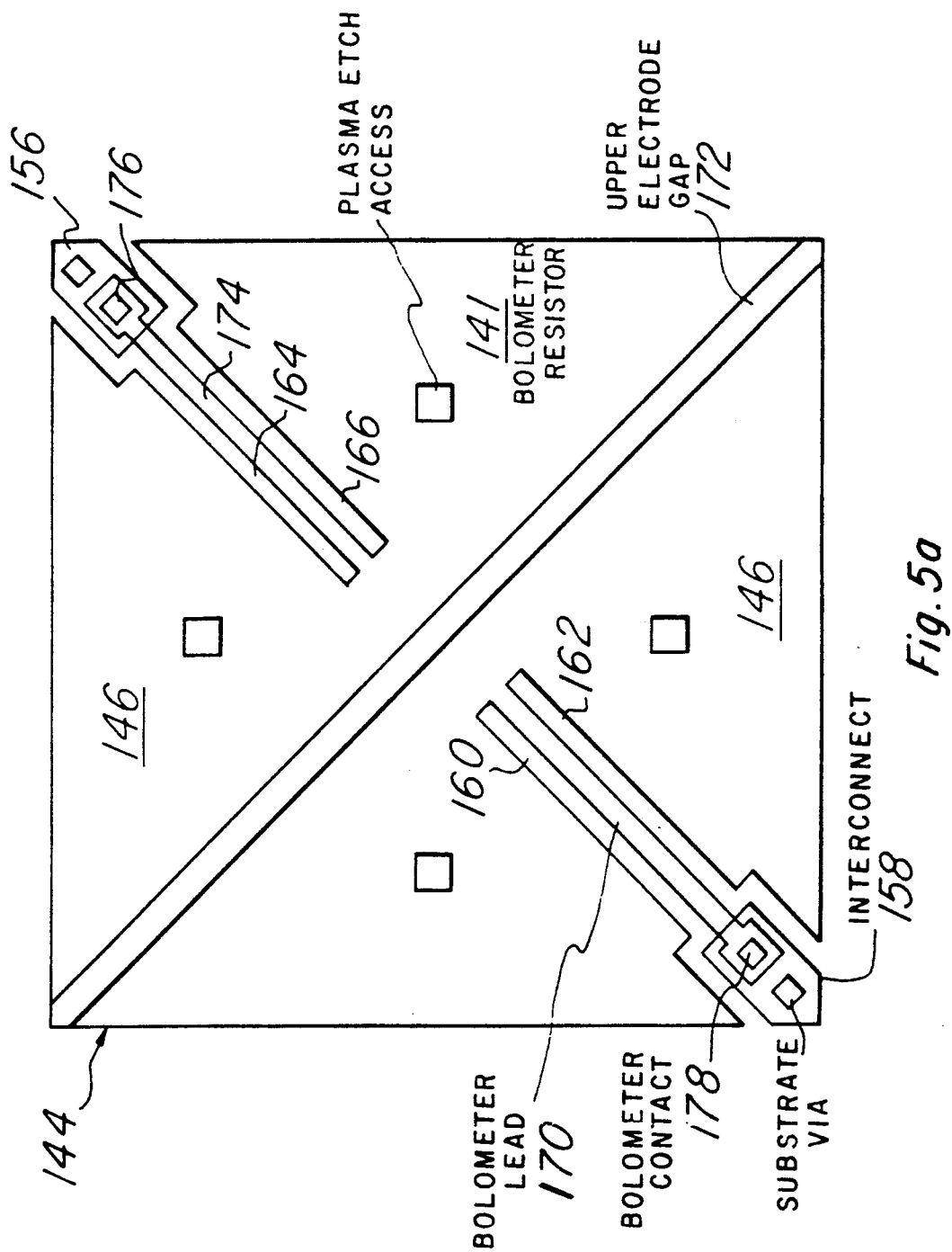
FIGS. 5a–b are plan views of a single bolometer of the first preferred embodiment array and a portion of the array.
Figure 5B:
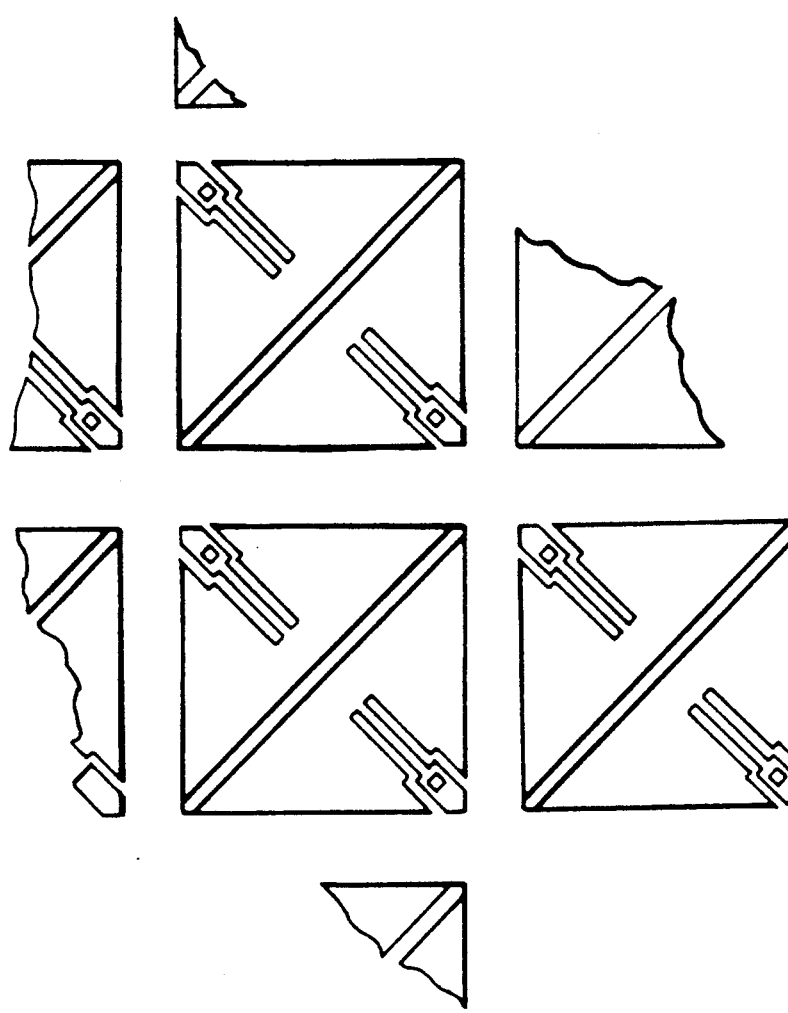

FIGS. 4a–b are schematic cross sectional elevation views of bolometer 140 and FIG. 5a is a plan view; FIG. 5b illustrates in plan view a portion of array 106 showing the arrangement of the individual bolometers. Bolometer 140 includes a 1,700 Å thick and 50 microns square stack 144 made of a top 500 Å layer of silicon dioxide (oxide) 146, a 100 Å layer of titanium nitride (TiN) 148, a 500 Å layer of hydrogenated amorphous silicon (a-Si:H) 150 doped with boron to a carrier concentration of $2 \times 10^{18}/cm^3$, another 100 Å layer of TiN 152, and a bottom 500 Å layer of silicon oxide 154. Stack 144 is supported over substrate 142 by two titanium tungsten (Ti:W) interconnects 156 and 158 located at diagonally opposite corners of the stack 144. As shown in FIG. 5a, stack 144 is square with two pairs of elongated openings 160, 162 and 164, 166 defining leads 170 and 174 between interconnects 156 and 158 and the remainder of stack 144 (resistor 141). Leads 170 and 174 are about 22 microns long and about 1.5 microns wide; this provides high thermal resistance. However, the heat loss from the main portion of stack 144 through leads 170 and 174 is more than an order of magnitude larger than the black-body radiation heat loss due to the temperature differential between resistor 141 and substrate 142. Upper electrode gap 172 separates upper oxide layer 146 and upper TiN layer 148 into two portions: one portion connected to interconnect 156 at contact 176 and the other portion connected to interconnect 158 at contact 178.

Vertical arrows 180 illustrate the direction of the direct current flow through a-Si:H 150. The current flow is from bias voltage supply 182 (5.8 volts) on substrate 142 through metal interconnect 156, into the half of TiN layer 148 on the contact 176 side of electrode gap 172, vertically down through a-Si:H 150 into TiN layer 152, vertically up through a-Si:H 150 into the half of TiN layer 148 on the contact 178 side of electrode gap 172, and lastly through interconnect 158 and load resistor 143 in substrate 142 to ground. The halves of TiN layer 148 and TiN layer 152 are highly conductive (about 800 $\mu\Omega$-cm resistivity) relative to a-Si:H 150 (about 1 M$\Omega$-cm resistivity) and may be considered equipotential surfaces. Thus resistor 141 is essentially two a-Si:H resistors in series, each a-Si:H resistor with a 500 Å length and a cross sectional shape of a 50 micron edge right triangle having a narrow notch extending from the right angle vertex nearly 90% of the way to the hypotenuse. The total resistance, $R_B$, is about 1.1 M$\Omega$ and $R_L$ is taken to be the same, so the total array 106 power dissipation in the resistors 141 and load resistors 143 is about 1 watt. The temperature coefficient of resistivity of a-Si:H 150 is about $-0.072$ per degree C. at a 300 degrees K. operating temperature of array 106.

Figure 6:
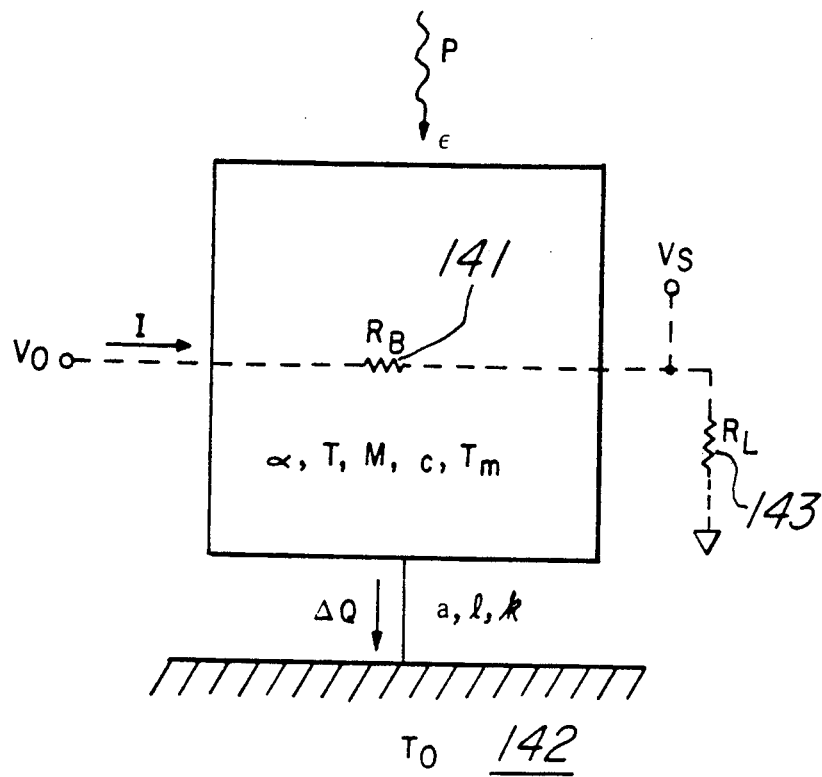
FIG. 6 illustrates a model for analysis of the operation of the first preferred embodiment.

The thermal time constant for resistor 141 is smaller than the period of chopper 104 for good sensitivity; this is analyzed infra. The cooling of resistor 141 is primarily by heat conduction through leads 170 and 174 and then through supports 156 and 158 to silicon substrate 142. In particular, FIG. 6 models the heat flow for resistor 141 with P the incident infrared radiant power, $\epsilon$ the fraction of the incident radiant power absorbed, T the temperature of resistor 141, $T_m$ the mean temperature of resistor 141, M the mass of resistor 141, c the specific heat of resistor 141, $R_B$ the resistance 141, k the thermal conductivity of the leads 170 and 174, a the cross sectional area of leads 170 and 174, l the length of leads 170 and 174, $T_O$ the temperature of substrate 142, $V_O$ the applied dc voltage, $\alpha$ the temperature coefficient of resistance of resistor 141, $R_L$ the resistance of load resistor 143, and $V_S$ the signal voltage.

The power input to resistor 141 is the absorbed radiant power ($\epsilon$P) plus the resistive heating power from $V_O$($i^2R_B$), and the power loss from resistor 141 is primarily heat conduction down the leads 170 and 174 due to the thermal gradient $$\left( ka \frac{dT}{dx} \right)$$

along the leads. The gradient may be approximated by a linear temperature change along the leads, so the power loss is $(k(a/l)(T-T_O))$. The net power input to resistor 141 causes a change in the temperature:

$$\epsilon P + i^2 R_B - K(T - T_0) = C \frac{dT}{dt}$$

where C=Mc is the thermal capacitance of $R_B$ and K=k(a/l) is the thermal conductance of leads 170 and 174. Note that both i and $R_B$ depend upon T; however, a linear approximation to the temperature dependence of $R_B$ makes the differential equation tractable. In particular, presume the temperature coefficient of resistance $\alpha$ $$\left( = -\frac{1}{R_B} \frac{dR_B}{dT} \right)$$

is constant over the range fluctuations of T. Typically, $T_O$ is about 300 degrees K., $T_m$ is about 315–320 degrees K., and the fluctuation of T is much less than one degree K. about $T_m$, so $\alpha$ constant is not a stringent presumption. For a-Si:H 150 $\alpha$ is about $-0.072$ at 320 degrees K., hence $\alpha(T-T_m)$ is small and a first order approximation is sufficiently accurate:

$$i^2 R_B = \frac{V_0^2 R_m}{(R_L + R_m)^2}\left[1 + \alpha(T - T_m)\left(\frac{R_L - R_m}{R_L + R_m}\right)\right]$$

where $R_m$ is the value of $R_B$ at temperature $T_m$, in other words, the mean resistance. The differential equation thus becomes:

$$C\frac{dT}{dt} + K(T - T_0) - \alpha(T - T_m)\frac{V_0^2 R_m}{(R_L + R_m)^2}\frac{R_L - R_m}{R_L + R_m} = \epsilon P + \frac{V_0^2 R_m}{(R_L + R_m)^2}$$

where T and P are the only functions of time, t. Rearranging the differential equation yields:

$$C\frac{d(T - T_m)}{dt} + (T - T_m)\left[K - \alpha\frac{V_0^2 R_m}{(R_L + R_m)^2}\frac{R_L - R_m}{R_L + R_m}\right] = \epsilon P + \frac{V_0^2 R_m}{(R_L + R_m)^2} - (T_m - T_0)K$$

where the second two terms on the right side of the equation are large (the heating powder due to the dc current and the cooling power by conduction through the leads) and substantially cancel, and the variables ($T-T_m$ and P) are small.

The radiant power input is chopped to improve signal-to-noise ratio. Thus the input radiant power is a square wave, and the resulting signal voltage can be computed from the foregoing equation to estimate the properties of bolometer array 106. The differential equation is easily solved by Fourier series expansion of P and $T-T_m$ and equating coefficients. That is, take P to be given by $$P(t) = P_0\left[\frac{1}{2} + \frac{2}{\pi}\sin(\omega t) + \frac{2}{3\pi}\sin(3\omega t) + \ldots\right]$$

and T to be $$T(t) = T_m + T_\omega \sin(\omega t - \phi) + T_{3\omega}\sin(3\omega t - \psi) + \ldots$$

where $\omega$ is the angular frequency of the chopping of the incident radiant power by the chopper 104. The zero order coefficients yield:

$$0 = \epsilon P_0 \frac{1}{2} + \frac{V_0^2 R_m}{(R_L + R_m)^2} - (T_m - T_0)K$$

The first order coefficients yield:

$$T_\omega = \frac{\epsilon P_0 \frac{2}{\pi}}{\sqrt{\omega^2 C^2 + K_{eff}^2}}$$

and $$K_{eff} = \left[K - \alpha\frac{V_0^2 R_m}{(R_L + R_m)^2}\frac{R_L - R_m}{R_L + R_m}\right]$$

and $$\phi = \arctan\frac{\omega C}{K_{eff}}$$

Note that neglecting $\epsilon P_O$ in the zero order equation and inserting the result in the expression for $K_{eff}$ yields:

$$K_{eff} = K\left[1 - \alpha(T_m - T_0)\frac{R_L - R_m}{R_L + R_m}\right]$$

so $K_{eff}$ is an effective heat conductance. Also, for chopping angular frequencies greater than $K_{eff}/C$ the amplitude of the fluctuations of T will decrease approximately inversely to $\omega$.

The second order coefficients (and all other even-order coefficients) vanish, and for higher odd-order coefficients $T_{n\omega}$ falls off like $1/n^2$ because $$P_{n\omega} = P_0 \frac{2}{n\pi}$$

and the derivative contributes another $1/n$. Thus approximate T by $T_m + T_\omega \sin(\omega t - \phi)$. This approximation, of course, is the exact solution for $$P = P_0\left(\frac{1}{2} + \frac{2}{\pi}\sin\omega t\right)$$

which are just the first two terms of the Fourier expansion of the square wave.

The output signal $V_S$ due to incident P is computed by inserting the resulting T, and thus $R_B$, into the definition of $V_S$ as the fluctuation of the voltage across $R_L$:

$$V_S = V_0\left[\frac{R_L}{R_B + R_L} - \frac{R_L}{R_m + R_L}\right]$$

which gives a first order approximation of $$V_S = -IR_m\alpha\frac{R_L}{R_L + R_m}T_\omega\sin(\omega t - \phi)$$

The response of the detector (the amplitude of $V_S$ divided by average incident power $P_O$) therefore increases with increasing I (the dc current), $R_m$, $\alpha$, and decreases with increasing C and $K_{eff}$ (which decreases $T_\omega$). Because the input impedance of amplifier 120 has to be larger than $R_B$, this puts an upper limit on $R_B$. Since any fluctuation of I causes a noise signal, the current I through bolometer 140 has to be extremely constant. This, and the requirement that the temperature rise by Joule heating should be small limits the maximum current I. $K_{eff}$ has a lower limit in the sense that even with perfect thermal isolation of resistor 141, a temperature difference of resistor 141 from substrate 142 gives a net radiation flux from resistor 141 to substrate 142.

The choice of $R_L$ to maximize the sensitivity of bolometer 140 is easily computed from the definition of $V_S$ by noting that this is just maximizing $$\frac{\partial V_S}{\partial R_B} \text{ at } R_B = R_m$$

as a function of $R_L$. This yields $R_L = R_m$. With this value of $R_L$, $K_{eff} = K$, $$T_\omega = \epsilon P_0 \frac{2}{\pi} / \sqrt{\omega^2 C^2 + K^2},$$

and $V_S = -\frac{1}{4} V_O \alpha T_\omega \sin(\omega t - \phi)$
which is independent of $R_m$.

The temperature response to a step input incident radiant power may also be computed by solving the first order approximation differential equation: Presume $P=0$ for $t<0$ and $P=P_O$ for $t>0$, then $$T = T_\infty - (T_\infty - T_0)e^{-t/\tau} \text{ with } \tau = \frac{C}{K_{eff}}$$

where $T_\infty$ is the asymptotic temperature and $T_O$ is the temperature prior to illumination. Thus the time constant of bolometer 140 is $\tau$.

To maximize the signal voltage amplitude (which is the responsitivity multiplied by the incident power), bolometer 140 should have a minimum thermal capacitance C and thermal conductance K and maximum active resistor absorbing area A, temperature coefficient $\alpha$, and absorption $\epsilon$. Bolometer 140 approaches these goals as follows. The thermal capacitance C is minimized by making stack 144 of thin films and the thermal conductance K is minimized by making leads 170 and 174 long and narrow. The active area A is maximized by integrating array 106 on a single silicon substrate and locating the detection circuitry under resistor 141 to provide high fill factor in array 106. The temperature coefficient $\alpha$ for thermister-type materials may be as high as 0.75 per degree K., but these materials are incompatible with silicon processing, and metal alloy films have coefficients of less than 0.01. So doped a-Si:H with a coefficient of about 0.07 provides a high coefficient together with silicon processing compatibility. Amorphous silicon is transparent to infrared radiation, so a high absorption $\epsilon$ is achieved by having the TiN resistor electrodes 148 and 152 also provide the absorption. This is free carrier absorption and can be optimized by choice of resistivity, thickness, and gap from stack 144 to ground plane 192. The analysis is as follows.

Figure 7:
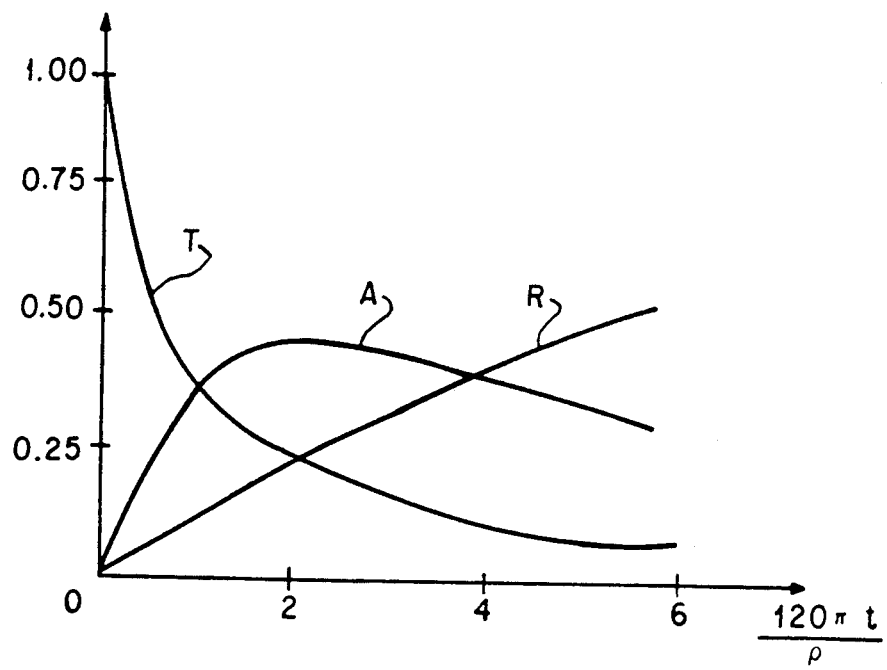
FIG. 7 shows theoretical absorption, reflection, and transmission curves.
Figure 8A:
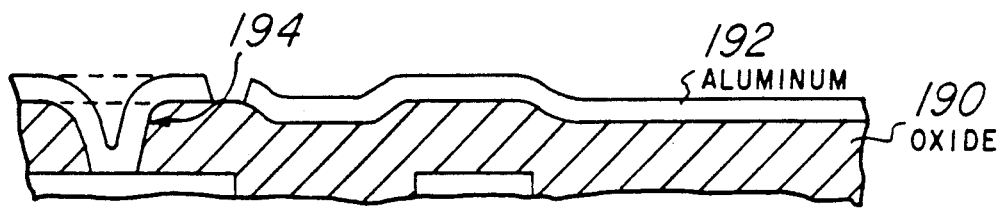
FIGS. 8a–g are cross sectional elevations views of steps of a preferred embodiment method of fabrication.
Figure 8B:
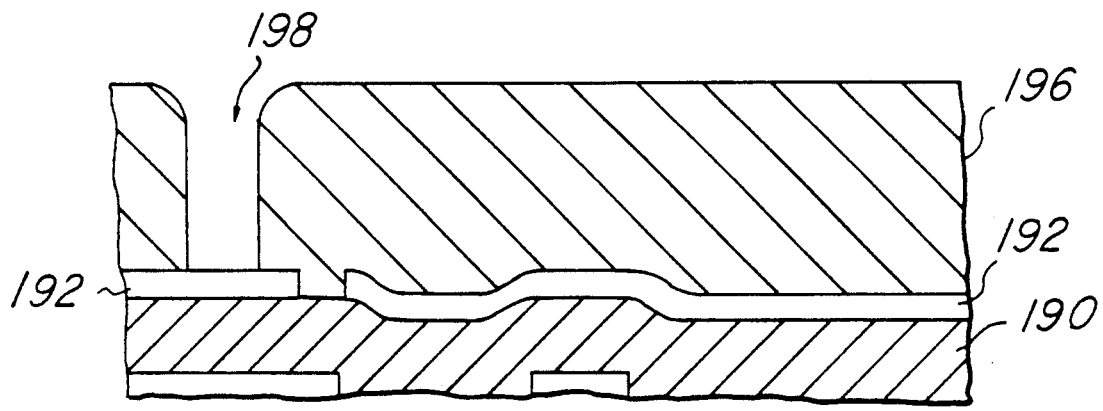
Figure 8C:
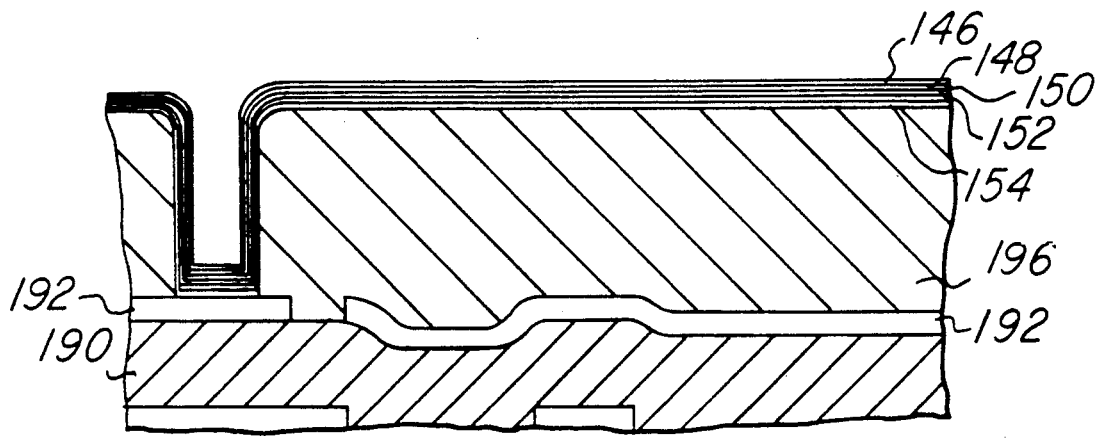
Figure 8D:
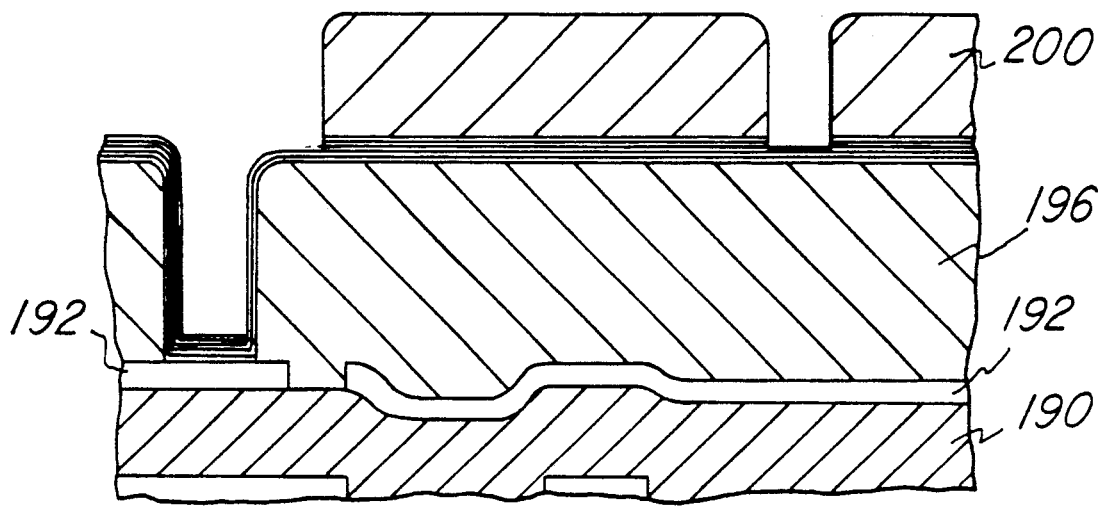
Figure 8E:
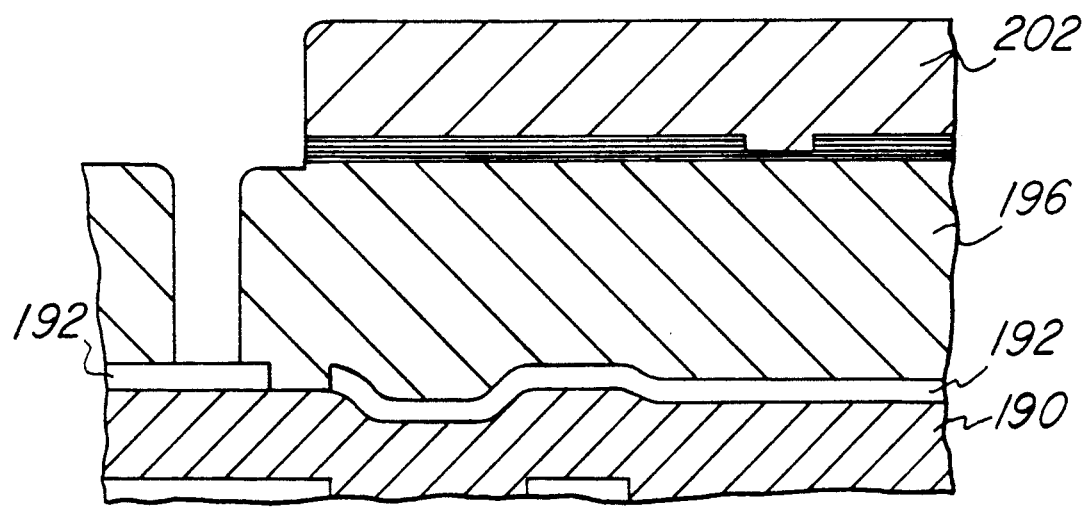
Figure 8F:
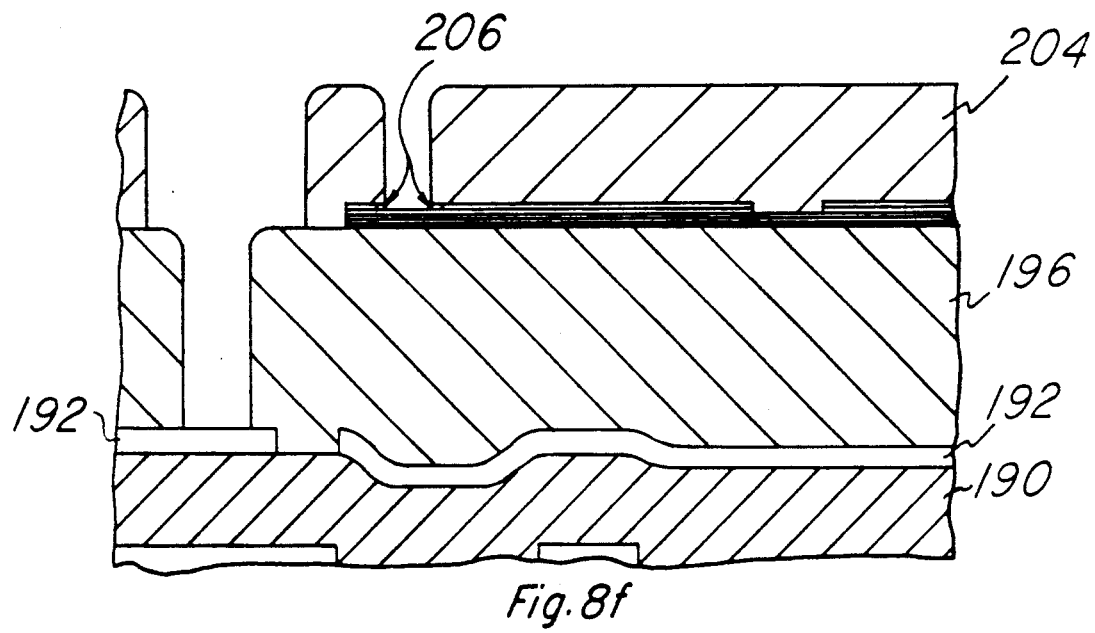
Figure 8G:
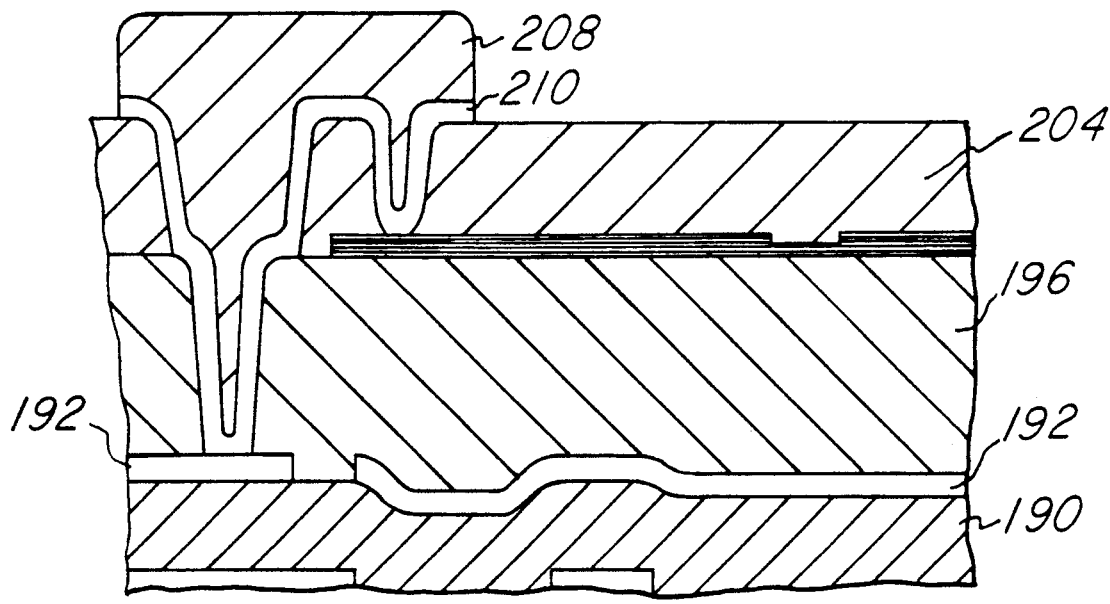
Figure 9A:
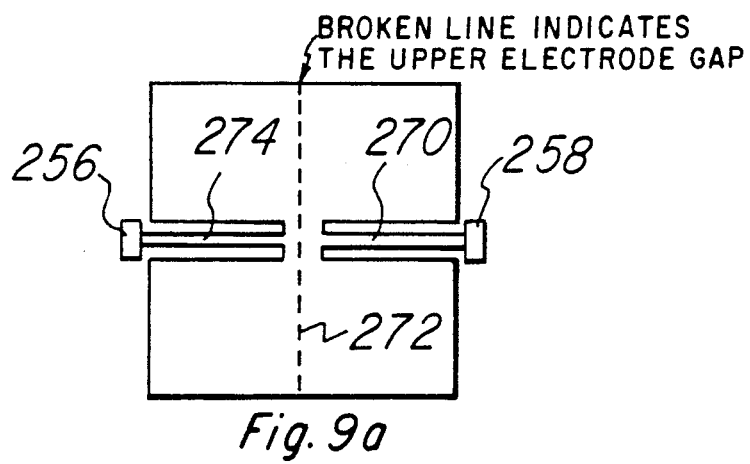
FIGS. 9a–e are plan views of further preferred embodiment single bolometers.
Figure 9B:
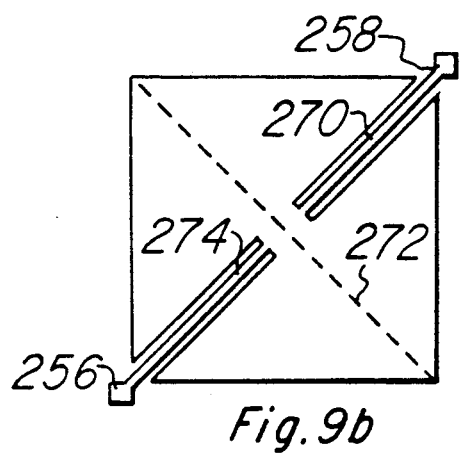
Figure 9D:
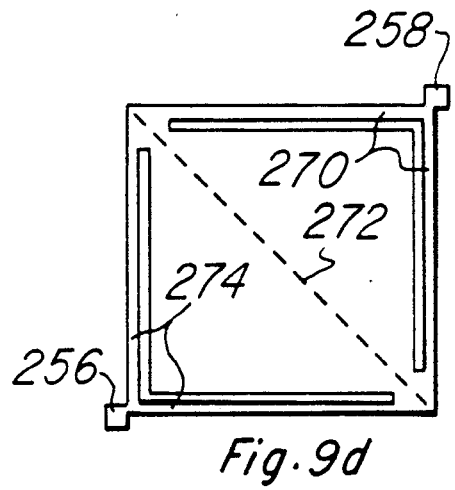
Figure 9C:
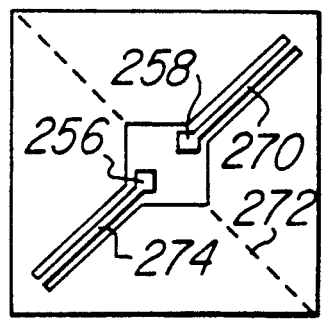
Figure 9E:
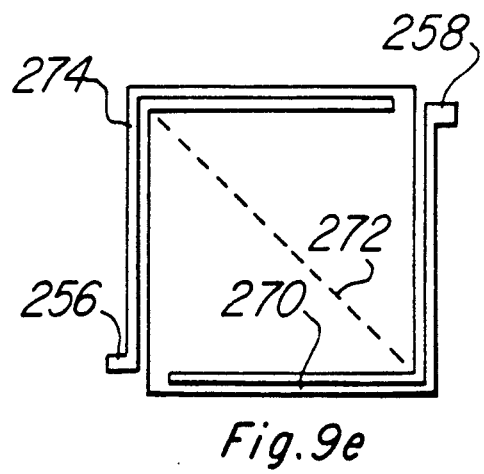

First, consider infrared radiation normally incident on a metal film of thickness t and resistivity $\rho$, and surrounded by air on both sides. The absorption A, reflection R, and transmission T are illustrated in FIG. 7 and computed from Maxwell's equations with the presumption that the index of refraction and the extinction coefficient of the metal are nearly equal, which is the case for wavelengths $\lambda \geq 10$ $\mu$m. The absorption has a maximum at $120\pi t/\rho = 2$.

Next, consider the addition of a thick conducting layer parallel to the metal film and at a distance of $\lambda/4$ away. Then nearly 100% absorption is achieved at $120\pi t/\rho = 1$. This analysis appears in L. Hadley et al, 37 J. Optical Soc. Am. 451 (1947).

For bolometer 140 operation with 8 to 12 micron spectral sensitivity, the center wavelength is 10 microns so the the distance from electrodes 148 and 152 to ground plane 192 is set at 2.5 microns (one quarter wavelength). The $120\pi t/\rho = 1$ requirement applies to the combination of layers 148 and 150 because the thickness of the transparent a-Si:H is small compared to the wavelength. Thus with a total thickness of 200Å, the resistivity should be equal to $120\pi \times 2 \times 10^{-6}$, or about 750 $\mu\Omega$-cm, and this is about the resistivity of reactivity sputtered TiN. For the 100 Å thick TiN electrodes 148 and 152 this translates to a sheet resistance of about 750$\Omega$/□. Note that other materials, including unannealed, sputtered silicides such as $MoSi_2$ and $WSi_2$, also are compatible with silicon processing and have appropriate resistivities. Because only the ratio of resistivity-to-thickness enters into the absorption analysis, the thickness of the electrodes 148 and 152 could be adjusted to compensate for the resistivity of the material used provided that the layer thickness is not so great as to significantly increase the thermal capacitance C nor so small as to yield nonreproducible film properties. Also, oxide 146 and 154 provide a sealing of TiN 148 and 152 so that the TiN is never subjected to any plasma etches, oxidation or hydration effets which might affect its resistivity. Stable sheet resistances for the TiN layers are important in maintaining the optimum infrared absorption and uniformity of absorption.

As shown in FIGS. 4a-b, oxide layer 190 covers and isolates load resistor $R_L$ and buffer amplifier 120 and the remainder of silicon substrate 142 from aluminum ground plane 192. The distance from aluminum ground plane 192 to the bottom of stack 144 is about 2.5 microns for detection in the 8-12 micron wavelength range; this distance from ground plane 192 to stack 144 is one quarter wavelength for the range's center frequency. FIG. 4a schematically shows ground plane 192 as flat; whereas, FIG. 4b illustrates some of the underlying circuitry (CMOS) in substrate 142 and indicates the slight (few hundred Å) unevenness of ground plane 192. TiN layers 148 and 152 provide the absorption of incident infrared radiation from the scene with warm body 116; amorphous silicon is transparent to infrared radiation. The quater wavelength distance from ground plane 192 to stack 144 creates a quarter wavelength absorption filter for free carrier absorption in the thin, semi-transparent TiN 148 and 152 with an underlying quarter wavelength vacuum gap and ground plane reflector. The unevenness of ground plane 192 has minimal effect on the absorption. Note that use of a vacuum gap for the absorption filter limits the thermal capacitance of stack 144 as compared to the use of a dielectric in the gap.

Consideration of the following description of a first preferred embodiment method of fabrication will provide further understanding of the first preferred embodiment bolometer and array characteristics and features. The first preferred embodiment method is illustrated in FIGS. 8a-g and includes the following steps.

(a) Form load resistors 143, buffer amplifiers 120, capacitors 122, addressing circuitry, metal interconnections and protective oxide 190 in silicon substrate 142 by standard CMOS processing. Photolithographically form circular openings 194 of diameter two microns in oxide layer 190 for contacts from interconnects 156 and 158 down to bias voltage 182 and load resistors 143 and capacitors 122. Sputter on 3,000 Å thick aluminum 192 which fills the openings in oxide 190 as shown in dotted lines in FIG. 4b, and pattern and etch aluminum 192 to isolate interconnect contacts from ground plane; see FIG. 8a in which all of the circuitry below the oxide level 190 has been omitted for clarity.

(b) Spin on layer 196 of photoimageable polyimide to a thickness of 2.5 microns on aluminum layer 192, and expose and develop a pattern of circular openings 198 about two microns in diameter for interconnects 156 and 158. Next, bake to fully imidize polyimide 196. See FIG. 8b in which the opening in oxide 190 has been suppressed for clarity. The interconnects 156 and 158 need not be located directly over openings 194, so the nonplanarity of aluminum 192 at openings 194 is not a problem.

(c) Sputter deposit in situ the layers that will form stack 144. In particular, place targets of oxide, titanium, and boron-doped silicon in a three target RF sputtering system. First sputter deposit a 500 Å thick oxide layer 154 from the oxide target in an argon atmosphere, next sputter deposit a 100 Å thick layer 152 of TiN from the titanium target in an argon/nitrogen atmosphere, then sputter deposit 500 Å thick layer 150 of boron-doped hydrogenated amorphous silicon from the boron-doped silicon target in an argon/hydrogen atmosphere, then another 100 Å thick TiN layer 148, and lastly another 500 Å thick oxide layer 146. See FIG. 8c, and note that polyimide 196 can withstand processing temperatures up to 300 degrees C which may be required during the amorphous silicon deposition to insure a low density of gap states and correspondingly large conductivity activation energy.

(d) Spin on layer 200 of photoresist and expose and develop it to define stack 144 plus electrode gap 172 for each pixel. Plasma etch with the patterned photoresist 200 as etch mask in a plasma of $CF_4 + O_2$; this plasma etches oxide, TiN, and silicon and is stopped in the amorphous silicon layer by endpoint detection of SiF* species in the reaction products. See FIG. 8d.

(e) Strip photoresist 200 and spin on second layer 202 of photoresist and expose and develop it to define stack 144 without electrode gap 172. Plasma etch with the patterned photoresist as etch mask in a plasma of $CF_4 + O_2$ to complete removal of the amorphous silicon, TiN, and oxide layers to form stack 144. This etch does not attack aluminum 192 and is stopped in polyimide 196 by endpoint detection of CO*; see FIG. 8e. Also, forming leads 170 and 174 from the same stack 144 as the temperature dependent resistor simplifies the processing.

(f) Strip second photoresist 202 and spin on third layer 204 of photoresist and expose and develop it to define the contacts 176 and 178. A wet etch of oxide 146 in a 10% solution of HF and with patterned photoresist 204 as etch mask, stops on TiN 148. The wet etch is isotropic and undercuts photoresist 204; see undercuts 206 in FIG. 8f. A light photoresist reflow sags photoresists 204 back to TiN 148 and eliminates the undercut overhang. Note that extreme selectivity in the etch is required because the TiN is only 100 Å thick, so is a sufficiently selective anisotropic plasma etch were used, then the undercut and consequent photoresist reflow would be avoided.

(g) Sputter deposit 5,000 Å layer 210 of Ti:W (an alloy of about 10% titanium to avoid the brittleness of pure tungsten) over patterned third photoresist 204. Spin on fourth layer 208 of photoresist and expose and develop it to define interconnects 156 and 158. Plasma etch the Ti:W in $SF_6$ with patterned fourth photoresist 208 as etch mask; this etch stops on photoresist 204. See FIG. 8g.

(h) Spin on PMMA (polymethylmethacrylate) for protection and saw the silicon wafers containing the bolometer arrays into chips. Spin and sprays the chips with chlorobenzene to remove the PMMA. Plasma ash the third and fourth photoresist layers 204 and 208 together with the polyimide layer 196. This completes the chips except for bonding and packaging. Note that in FIG. 5a plasma etch access holes are shown in stack 144; these holes are etched through the oxide, TiN, and amorphous silicon layers when stack 144 is being formed and these holes reduces the amount of time required for the isotropic plasma ashing of the polyimide layer under stack 144.

Estimates on the performance of bolometer 140 with a chopping frequency of 30 Hz for chopper 104 can be computed as follows. First estimate the heat capacity C of stack 144 (taken to be 50 microns square) as $7.6 \times 10^{-10}$ joules/degree C by estimating the volumetric specific heats of oxide, TiN, and a-Si:H to be 1.7, 2.34, and 1.72 joules/cm$^3$-degree C, respectively. Next, estimate the thermal conductivity, K, of leads 170 plus 174 as $4.6 \times 10^{-7}$ watts/degree C by estimating the thermal conductivity of oxide, TiN, and a-Si:H to be about 0, 0.2, and 0.84 watts/degree C, respectively, and the length and width of leads 170 and 174 to be 20 microns and 1 micron. Then inserting these values into $1/\sqrt{\omega^2 C^2 + K^2}$ yields:

$$T_\omega / \epsilon P_0 \frac{2}{\pi} = 1.8 \times 10^6 \text{ degrees C./watt}$$

and the time constant $\tau = C/K = 1.7$ msec.

Presume a 1 degree C scene temperature difference in the 8-12 micron wavelength range (i.e., warm body 116 is 1 degree warmer than his surroundings and both have emissivities of 1.0 in 8-12 microns), an infrared lens system 102 with f/1 optics, and an irradiance level of $5.16 \times 10^{-5}$ watts/cm$^2$. Further presume $\epsilon = 0.5$ (including the quarter wavelength filter with ground plane 192 would increase this to $\epsilon \approx 1.0$), then the temperature fluctuation magnitude $T_\omega$ equals $0.76 \times 10^{-3}$ degree C. Inserting this into the expression for the signal voltage amplitude supra yields a signal voltage amplitude of 78 $\mu$V (13 $\mu$V per volt of bias). This level of operation provides a total power dissipation of about 1 watt in array 106 and a mean temperature rise of about 17 degrees C ($T_m - T_O$).

Noise estimates for bolometer 140 may be computed with foregoing persumed parameters by following the 1984 Liddiard reference cited in the Background. This yields a noise equivalent power (NEP) from Johnson and thermal fluctuation noise of about $2.5 \times 10^{-11}$ watts. This translates to a noise equivalent temperature difference (NETD) of 0.02 degree K.

Further preferred embodiment bolometers and arrays are illustrated in plan views in FIGS. 9a-e; these plan views are analogs of FIG. 5a for bolometer 140 and show the suspended resistor, leads, and interconnect to the underlying substrate containing the load resistor, signal voltage amplifier, and addressing. In particular, the upper electrode gap analogous to gap 172 of bolometer 140 is indicated by a broken line 272 in each FIGS.

9a–e, and the interconnects to the substrate analogous to interconnects 156 and 158 of bolometer 140 are indicated by 256 and 258. Similarly, the analogs of leads 170 and 174 are indicated by 270 and 274; note that in the preferred embodiment of FIG. 9d the leads are bifurcated.

MODIFICATIONS AND ADVANTAGES

Various modifications of the preferred embodiment devices and methods may be made while retaining features such as a temperature dependent resistor suspended over related processing circuitry for a high fill factor and avoidance of resistor edge passivation, a temperature dependent resistor made of a radiation absorbing material on a transparent high temperature coefficient material, a quarter wavelength filter absorber, and in situ deposition of resistor materials for uniform and reproducible resistors.

For example, the dimensions, shapes, and materials of the stack forming the temperature dependent resistor may be varied, although the absorption efficiency depends upon the sheet resistance and processing-compatible materials are needed for manufacturability; the contact arrangement for the temperature dependent resistor could be varied such as one contact and one bottom contact so the electrode gap would not be needed, or two bottom contacts; the passivation layer (oxide 146 and 154 in preferred embodiment 140) on the temperature dependent resistor contacts could be omitted and thereby lower the thermal capacitance; the edges of the temperature dependent resistor could be passivated to limit surface leakage (such as by oxide deposition after step (e) in the first preferred embodiment method); the air bridge interconnects 156 and 158 of bolometer 140 could be replaced by direct interconnect metal if the temperature dependent resistor is insulated to avoid the interconnects shorting out the top and bottom contacts; and the amorphous silicon resistive layer 150 could be heavily doped adjacent to the titanium nitride layers 148 and 152 in order to lower specific contact resistance and contact noise, of course the thickness of the high resistivity amorphous silicon will remain constant.

The invention provides the advantage high fill factor arrays.

What is claimed is:

1. An array of bolometers for detecting radiation in a spectral range, comprising:
   (a) a substrate including an array of bolometer circuit elements adjacent a first surface;
   (b) an array of resistors, each of said resistors having leads and spaced from said surface by about one quarter wavelength of the center of said spectral range, said resistor plus leads being formed from a stack including a first conductive layer, a resistive layer, and a second conductive layer with said second conductive layer the closest layer to said surface, each of said resistors further oriented to receive radiation, and located over and electrically connected to a corresponding set of said circuit elements.

2. The array of claim 1, further comprising:
   (a) a chopper for the radiation received by said resistors.

3. The array of claim 1, wherein:
   (a) each of said resistors is mechanically connected to said surface by connections that attach to said surface by connections that attach to said leads on said first conductive layer; and
   (b) said stack is supported solely by said connections.

4. The array of claim 1, wherein:
   (a) said first conductive layer is split into two regions; and
   (b) said two regions are connected to said corresponding circuit elements by said leads plus air bridges.

5. The array of claim 1, wherein:
   (a) said second conductive layer has a passivation layer;
   (b) said surface is reflective; and
   (c) the space between said surface and said passivation layer is evacuated.

6. The array of claim 1, wherein:
   (a) the sheet resistance of said first and second conductive layers provides at least 50% absorption in said spectral band.

7. The array of claim 1, wherein:
   (a) said stack includes a first passivation layer on said first conductive layer and a second passivation layer on said second conductive layer;
   (b) said first and second passivation layers are silicon dioxide;
   (c) said first and second conductive layers are titanium nitride; and
   (d) said resistive layer is amorphous silicon.

8. A bolometer for detecting radiation in a spectral range, comprising:
   (a) a resistor formed from a planar stack, said stack including (i) a planar layer of resistive material with first and second surfaces, the resistivity of said resistive material depending upon temperature, (ii) a first layer of a first conducting material abutting said first surface, (iii) a second layer of a second conducting material abutting said second surface, said first layer split into first and second regions which form the two terminals of the resistor;
   (b) said resistor oriented to receive radiation in a spectral range; and
   (c) a detector for detecting the resistivity of said resistor.

9. The bolometer of claim 8, further comprising:
   (a) said layer of resistive material having high conductivity adjacent said first layer and said second layer.

10. The bolometer of claim 8, further comprising:
    (a) a chopper for the radiation received by said resistor.

11. The bolometer of claim 8, further comprising:
    (a) a third layer of a third conducting material, said third layer parallel to and spaced from said second layer a distance equal to about one quarter of the wavelength of the center of said spectral range.

12. The bolometer of claim 11, wherein:
    (a) the thickness and conductivities of said first layer and said second layer are characterized by at least 50% absorption at the center of said spectral range by said resistor.

13. The bolometer of claim 8, wherein:
    (a) said resistive material is amorphous silicon;
    (b) said first and second conductivity materials are titanium nitride; and
    (c) said stack is characterized by in situ deposition of said second layer, said planar layer, and said first layer.

14. The bolometer of claim 10, wherein:

(a) said two regions are connected to said detector by leads plus air bridges.

15. A method of detecting radiation in a spectral range, comprising the steps of:
   (a) providing a resistive material which is substantially transparent to radiation in a spectral range;
   (b) providing conducting material on said resistive material;
   (c) providing a reflecting material spaced from said conducting material by a substantially transparent material;
   (d) wherein the thickness and conductivity of said conducting material and said reflecting material spacing are characterized by at least 50% absorption about the center of a spectral range; and
   (e) measuring the temperature of said resistive material when exposed to radiation in the spectral range.

16. The method of claim 15, further comprising the step of:
   (a) chopping the radiation received by said materials.

17. The method of claim 15, wherein:
   (a) said conducting materials is titanium nitride;
   (b) said resistive material is amorphous silicon; and
   (c) said reflecting material is aluminum.

18. A method of fabrication of an infrared imager, comprising the steps of:
   (a) forming an array of bolometer circuitry at a surface of a substrate;
   (b) forming a spacer layer over said circuitry;
   (c) forming a resistor stack on said spacer layer;
   (d) forming connections from said resistor stack to said circuitry; and
   (e) removing said spacer layer.

19. The method of claim 18, further comprising the step of:
   (a) forming a reflective layer over said bolometer circuitry prior to said forming a spacer layer.

20. The method of claim 18. wherein:
   (a) said forming a resistor stack is by in situr deposition of a passivation layer, a conductive layer, a resistive layer, another conductive layer, and another passivation layer.

21. An array of bolometers for detecting radiation in a spectral range, comprising:
   a substrate including an array of bolometer circuitry elements adjacent a first surface of said substrate; and
   an array of resistors the value of which varies with received radiation, each of said resistor spaced from a corresponding circuit element by about one quarter wavelength of the center of said spectral range, oriented to receive radiation, and located over and electrically connected said corresponding set of said circuit elements.

22. An array of bolometers for detecting radiation in an spectral range, comprising:
   a substrate having a first surface;
   an array of resistors the value of which varies with received radiation, oriented to receive radiation, each of said resistors having a selected and spaced above said substrate a selected distance so as to substantially cover a selected area of said first surface; and
   an array of bolometer circuit elements sets formed at said first surface, selected ones of said circuit element sets connected to corresponding ones of said variable resistors in said array, and located within said selected area below said corresponding resistors.

23. The array of claim 22, wherein:
   (a) each of said resistors has leads, and said resistor plus leads are formed from a stack including a first conductive layer, a resistive layer, and a second conductive layer with said second conductive layer the closest layer to said surface.

24. The array of claim 23, wherein:
   (a) each of said resistors is mechanically connected to said surface by connections that attach to said leads on said first conductive layer; and
   (b) said stack is supported solely by said connections.

25. The array of claim 23, wherein:
   (a) said first conductive layer is split into two regions; and
   (b) said two regions are connected to said corresponding circuit elements by said leads plus air bridges.

26. The array of claim 22 wherein said circuit element set and said variable resistor are separated by about one quarter wavelength of the center of the spectral range.

27. The array of claim 22, wherrein the spacing between the nominal top surface of a circuit element set and the bottom most surface of the corresponding variable resistor is about one quarter wavelength of the center of the spectral range.

28. An array of bolometers having resistors which vary with received radiation in a spectral range, said array comprising:
   (a) a plurality of pixels formed in a layered structure; and
   (b) said layered structure including a substrate, circuit elements formed on said substrate, a conducting radiation reflecting layer insulated from and located on said circuit elements, said conducting layer acting as a ground plane and radiation reflector, a spacer layer located on said reflector layer, said spacer layer defining a well above said circuit elements, and said radiation variable resistors supported by said spacer layer and located above said well.

29. The array of claim 28 wherein the distance from said circuit elements and said reflector is about one quarter of the wavelength of the center of the spectral range.

30. The array of claim 28 where each of said variable resistors has leads, and said resistor plus leads being formed from a stack including a first conductive layer, a resistive layer, and a second conductive layer with said second conductive layer being the closest to said surface.

31. The array of claim 29 wherein said first conductive layer is split into two regions, and said two regions are connected to said corresponding circuit elements by said leads plus air bridge.

* * * * *

REEXAMINATION CERTIFICATE (3246th)
United States Patent [19]
Hornbeck

[11] B1 5,021,663
[45] Certificate Issued Jul. 1, 1997

[54] INFRARED DETECTOR

[75] Inventor: Larry J. Hornbeck, Van Alstyne, Tex.

[73] Assignee: Texas Instruments Incorporated, Dallas, Tex.

Reexamination Request:
No. 90/004,242, May 14, 1996

Reexamination Certificate for:
Patent No.: 5,021,663
Issued: Jun. 4, 1991
Appl. No.: 597,280
Filed: Oct. 15, 1990

Related U.S. Application Data

[63] Continuation of Ser. No. 231,797, Aug. 12, 1988, abandoned.

[51] Int. Cl.⁶ .................. G01J 5/20; G01J 5/22; G01J 5/02
[52] U.S. Cl. .......... 250/349; 250/338.1; 250/338.4; 250/342; 250/370.01

[56] References Cited

U.S. PATENT DOCUMENTS

| | | | |
|---|---|---|---|
| 3,693,011 | 9/1972 | DeVaux et al. | 250/370.01 |
| 3,801,949 | 4/1974 | Larrabee | 338/22 R |
| 3,898,605 | 8/1975 | Burns | 338/18 |
| 4,009,516 | 3/1977 | Chiang et al. | 29/592.1 |
| 4,162,402 | 7/1979 | Hopper | 250/332 |
| 4,169,273 | 9/1979 | Hendrickson | 348/311 |
| 4,239,312 | 12/1980 | Myer et al. | 439/69 |
| 4,354,109 | 10/1982 | Gelpey et al. | 250/349 |
| 4,365,106 | 12/1982 | Pulvari | 136/206 |
| 4,378,489 | 3/1983 | Chabinsky et al. | 219/543 |
| 4,379,232 | 4/1983 | Hopper | 250/332 |
| 4,463,493 | 8/1984 | Momose | 437/38 |
| 4,574,263 | 3/1986 | Liddiard | 338/18 |
| 4,654,622 | 3/1987 | Foss et al. | 338/14 |
| 4,784,973 | 11/1988 | Stevens et al. | 437/200 |
| 4,871,921 | 10/1989 | Gurnee | 250/208.1 |
| 4,922,116 | 5/1990 | Grinberg et al. | 250/495.1 |
| 5,010,251 | 4/1991 | Grinberg et al. | 250/332 |
| 5,300,915 | 4/1994 | Higashi et al. | 338/22 R |
| 5,455,421 | 10/1995 | Spears | 250/338.4 |

OTHER PUBLICATIONS

K. C. Liddiard, "Thin–Film Resistance Bolometer IR Detectors–II," *Infrared Phys.* vol. 26, No. 1 (1986) pp. 43–49.

Walter F. Kosonocky, Frank V. Shallcross, Thomas S. Villani and Joseph V. Groppe, "160×244 Element PtSi Schottky–Barrier IR–CCD Image Sensor," *IEEE Transactions on Electron Devices*, vol. ED–32, No. 8 (Aug. 1985) pp. 1564–1573.

K. C. Liddiard, "Thin–Film Resistance Bolometer IR Detectors," *Infrared Phys.* vol. 24, No. 1 (1984) pp. 57–64.

Hammam Elabd and Walter F. Kosonocky, "Theory and Measurements of Photoresponse for Thin Film $Pd_2Si$ and PtSi Infrared Schottky–Barrier Detectors With Optical Cavity," *RCA Review*, vol. 43 (Dec. 1982) pp. unknown.

Kurt Peterson & Anne Shartel, "Micromechanical Accelerometer Integrated with MOS Detection Circuitry," IBM Research Laboratory (1980).

Ryoichi Takayama, Yoshihiro Tomita, Kenji Iijima & Ichiro Ueda, "Pyroelectric linear array infrared sensors made of c–axis–oriented La–modified $PbTiO_3$ thin films," Matsushita Electric Industrial Co., Ltd. (Feb. 8, 1988).

*Primary Examiner*—Constantine Hannaher
*Attorney, Agent, or Firm*—Brian A. Carlson; Christopher L. Maginniss; Richard L. Donaldson

[57] ABSTRACT

Preferred embodiments include a monolithic uncooled infrared detector array of bolometers fabricated over a silicon substrate (142); the bolometers include a stack (144) of oxide (146) TiN (148), a-Si:H (150), TiN (152), oxide (154) with the TiN forming the infrared absorbers and resistor contacts and the a-Si:H the resistor with a high temperature coefficient of resistivity. The resistor is suspended over the silicon substrate (142) by metal interconnects (154 and 156) and related processing circuitry is formed in the silicon substrate (142) beneath the resistor.

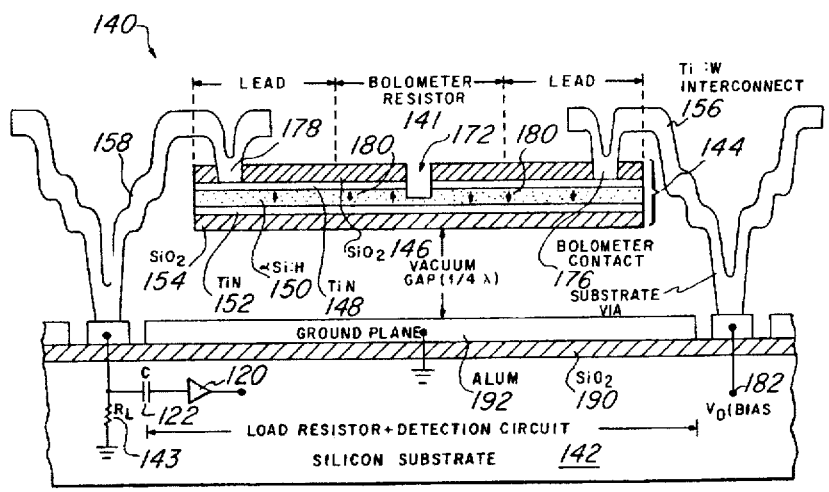

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 8–12 and 14 is confirmed.

Claims 6, 19, 21, 24 and 29 are cancelled.

Claims 1, 3, 4, 13, 15, 17, 18, 20, 22, 25, 27, 28, 30 and 31 are determined to be patentable as amended.

Claims 2, 5, 7, 16, 23 and 26, dependent on an amended claim, are determined to be patentable.

New claims 32–38 are added and determined to be patentable.

1. An array of bolometers for detecting radiation in a spectral range, comprising:
   (a) a substrate including an array of bolometer circuit elements *sets* adjacent a [first] surface; *and*
   (b) an array of resistors, each of said resistors having leads and spaced from said surface by about one quarter wavelength of the center of said spectral range, said resistor plus *said* leads being formed from a stack including a first conductive layer, a resistive layer, and a second conductive layer with said second conductive layer the closest layer to said surface, each of said resistors further oriented to receive radiation, and located over and electrically connected to a corresponding [set] *one* of said circuit elements *sets, wherein the sheet resistance of said first and second conductive layers provides at least 50% absorption in said spectral range.*

3. [The array of claim 1, wherein: (a)] *An array of bolometers for detecting radiation in a spectral range, comprising:*
   (a) *a substrate including an array of bolometer circuit elements sets adjacent a surface; and*
   (b) *an array of resistors, each of said resistors having leads and spaced from said surface by about one quarter wavelength of the center of said spectral range, said resistor plus said leads being formed from a stack including a first conductive layer, a resistive layer, and a second conductive layer with said second conductive layer the closest layer to said surface, each of said resistors further oriented to receive radiation, and located over and electrically connected to a corresponding one of said circuit elements sets; wherein* each of said resistors is mechanically [connected to] *supported above* said surface by [connections] *supports* that attach to said [surface by connections that attach to said] leads on said first conductive layer; and [(b) said stack is supported solely by said connections] *wherein said supports consist essentially of electrically conductive connections.*

4. [The array of claim 1, wherein: (a)] *An array of bolometers for detecting radiation in a spectral range, comprising:*
   (a) *a substrate including an array of bolometer circuit elements sets adjacent a surface; and*
   (b) *an array of resistors, each of said resistors having leads and spaced from said surface by about one quarter wavelength of the center of said spectral range, said resistor plus said leads being formed from a stack including a first conductive layer, a resistive layer, and a second conductive layer with said second conductive layer the closest layer to said surface, each of said resistors further oriented to receive radiation, and located over and electrically connected to a corresponding one of said circuit elements sets, wherein* said first conductive layer is split into two [regions;] *regions, and* [(b)] said two regions are connected to said corresponding *one of said* circuit elements *sets* by said leads plus air bridges.

13. The bolometer of claim 8, wherein:
    (a) said resistive material is amorphous silicon;
    (b) said first and second [conductivity] *conducting* materials are titanium nitride; and
    (c) said stack is characterized by in situ deposition of said second layer, said planar layer, and said first layer.

15. A method of detecting radiation in a spectral range, comprising the steps of:
    (a) providing a resistive material which is substantially transparent to radiation in a spectral range;
    (b) providing conducting material on said resistive material;
    (c) providing a reflecting material spaced from said conducting material by a substantially transparent material;
    (d) wherein the thickness and conductivity *and sheet resistance* of said conducting [material and] *material, together with* said reflecting material [spacing are characterized by] *spacing, provide* at least 50% *total* absorption about the center of a spectral range; and
    (e) measuring the temperature of said resistive material when exposed to radiation in the spectral range.

17. The method of claim 15, wherein:
    (a) said conducting [materials] *material is* titanium nitride;
    (b) said resistive material is amorphous silicon; and
    (c) said reflecting material is aluminum.

18. A method of fabrication of an infrared imager, comprising the steps of:
    (a) forming an array bolometer circuitry at a surface of a substrate;
    (b) *forming an infrared reflective layer over said circuitry;*
    (c) forming a spacer layer over said [circuitry;] *reflective layer;*
    [(c)] (*d*) forming a resistor stack on said spacer [layer;] *layer, said resistor stack spaced from said reflective layer by about one quarter wavelength of the center of a spectral range of infrared radiation having wavelengths of 8–12 μm;*
    [(d)] (*e*) forming connections from said resistor stack to said circuitry; and
    [(e)] (*f*) removing said spacer layer.

20. The method of claim [18.] *18,* wherein:
    (a) said forming a resistor stack is by in [situr] *situ* deposition of a passivation layer, a conductive layer, a resistive layer, another conductive layer, and another passivation layer.

22. An array of bolometers for detecting radiation in [an] a spectral range, comprising:

a substrate having a [first] surface;

an array of resistors the value of which varies with received radiation, oriented to receive radiation, each of said resistors [having a selected and] spaced above said substrate a selected distance *and having a selected shape* so as to substantially cover a selected area of said [first] surface; and an array of bolometer circuit elements sets formed at said [first] surface, selected ones of said circuit [element] *elements* sets connected to corresponding ones of said variable resistors in said array, and located within said selected area below said corresponding resistors, *wherein each of said resistors is mechanically supported above said substrate by supports consisting essentially of electrically conductive interconnects.*

25. [The array of claim 23, wherein: (a)] *An array of bolometers for detecting radiation in a spectral range, comprising:*

*a substrate having a surface;*

*an array of resistors the value of which varies with received radiation, oriented to receive radiation, each of said resistors spaced above said substrate a selected distance and having a selected shape so as to substantially cover a selected area of said surface; and*

*an array of bolometer circuit elements sets formed at said surface, selected ones of said circuit elements sets connected to corresponding ones of said variable resistors in said array, and located within said selected area below said corresponding resistors, wherein each of said resistors has leads, and said resistor plus leads are formed from a stack including a first conductive layer, a resistive layer, and a second conductive layer with said second conductive layer the closest layer to said surface, and wherein* said first conductive layer is split into two [regions;] *regions,* and [(b)] said two regions are connected to said corresponding circuit elements by said leads plus air bridges.

27. The array of claim 22, [wherrein] *wherein* the spacing between the nominal top surface of a circuit element set and the bottom most surface of the corresponding variable resistor is about one quarter wavelength of the center of the spectral range.

28. An array of bolometers having resistors which vary with received radiation in a spectral range *of infrared radiation,* said array comprising:

(a) a plurality of pixels formed in a layered structure; and (b) said layered structure including a substrate, circuit elements formed on said substrate, a conducting radiation reflecting layer insulated from and located on said circuit elements, said conducting layer acting as a ground plane and radiation reflector, a spacer layer located on said reflector layer, said spacer layer defining a well above said circuit elements, and said radiation variable resistors supported by said spacer layer and located above said well *at a distance from said reflecting layer of about one quarter wavelength of the center of said spectral range, wherein the wavelengths of said spectral range are 8–12 μm.*

30. The array of claim 28 [where] *wherein* each of said variable resistors has leads, and said resistor plus leads being formed from a stack including a first conductive layer, a resistive layer, and a second conductive layer with said second conductive layer being the closest to said [surface.] *reflecting layer.*

31. [The array of claim 29] *An array of bolometers having resistors which vary with received radiation in a spectral range, said array comprising:*

(a) *a plurality of pixels formed in a layered structure; and*

(b) *said layered structure including a substrate, circuit elements formed on said substrate, a conducting radiation reflecting layer insulated from and located on said circuit elements, said conducting layer acting as a ground plane and radiation reflector, a spacer layer located on said reflector layer, said spacer layer defining a well above said circuit elements, and said radiation variable resistors supported by said spacer layer and located above said well, wherein each of said variable resistors has leads, and said resistor plus leads being formed from a stack including a first conductive layer, a resistive layer, and a second conductive layer with said second conductive layer being the closest to said surface, and* wherein said first conductive layer is split into two regions, and said two regions are connected to said corresponding circuit elements by said leads plus air [bridge] *bridges.*

32. *The array of claim 28, wherein said resistors comprise a radiation absorbing material with a sheet resistance providing at least 50% absorption in said spectral range.*

33. *An array of bolometers for detecting radiation in a spectral range of infrared radiation, comprising:*

*a substrate including an array of bolometer circuit elements sets;*

*an infrared reflective layer overlying said substrate, and spaced therefrom by a layer of insulating material; and*

*an array of resistors the value of which varies with received radiation, said array of resistors spaced from said infrared reflective layer by about one quarter wavelength of the center of said spectral range, each of said resistors oriented to receive radiation, and located over and electrically connected to one of said circuit elements sets, wherein each of said resistors is mechanically supported above said substrate by supports consisting essentially of electrically conductive interconnects.*

34. *An array of bolometers for detecting radiation in a spectral range of infrared radiation, comprising:*

(a) *a substrate including an array of bolometer circuit elements sets;*

(b) *an infrared reflective layer overlying said substrate, and spaced therefrom by a layer of an insulating material; and*

(c) *an array of resistors, each of said resistors having leads and spaced from said reflective layer by about one quarter wavelength of the center of said spectral range, said spectral range having wavelengths of 8–12 μm, said resistor plus said leads being formed from a stack including a first conductive layer, a resistive layer, and a second conductive layer with said second conductive layer the closest layer to said reflective layer, each of said resistors further oriented to receive radiation, and located over and electrically connected to a corresponding one of said circuit elements sets.*

35. *An array of bolometers for detecting radiation in a spectral range of infrared radiation, comprising:*

*a substrate including an array of bolometer circuit elements sets;*

*an infrared reflective layer overlying said substrate, and spaced therefrom by a layer of an insulating material; and* an array of resistors the value of which varies with received radiation, said array of resistors spaced from said infrared reflective layer by about one quarter wavelength of the center of said spectral range, each of said resistors oriented to receive radiation, and located over and electrically connected to one of said circuit elements sets, wherein said resistors comprise a radiation absorbing material with a sheet resistance providing at least 50% absorption in said spectral range, and wherein each of said resistors is mechanically supported above said substrate by supports consisting essentially of electrically conductive interconnects.

36. An array of bolometers for detecting radiation in a spectral range of infrared radiation, comprising:

a substrate including an array of bolometer circuit elements sets;

an infrared reflective layer overlying said substrate, and spaced therefrom by a layer of an insulating material; and an array of resistors the value of which varies with received radiation, said array of resistors spaced from said infrared reflective layer by about one quarter wavelength of the center of said spectral range, said spectral range having wavelengths of 8–12 μm, each of said resistors oriented to receive radiation, and located over and electrically connected to one of said circuit elements sets, wherein said resistors comprise a radiation absorbing material with a sheet resistance providing at least 50% absorption in said spectral range.

37. An array of bolometers for detecting radiation in a spectral range of infrared radiation, comprising:

a substrate having a surface;

an infrared reflective layer overlying said substrate, and spaced therefrom by a layer of an insulating material;

an array of resistors the value of which varies with received radiation, oriented to receive radiation, each of said resistors spaced above said infrared reflective layer a selected distance and having a selected shape so as to substantially cover a selected area of said surface; and an array of bolometer circuit elements sets formed at said surface, selected ones of said circuit elements sets connected to corresponding ones of said resistors in said array, and located within said selected area below said corresponding resistors, wherein said resistors comprise a radiation absorbing material with a sheet resistance providing at least 50% absorption in said spectral range, and wherein the wavelengths of said spectral range are 8–12 μm.

38. An array of bolometers having resistors which vary with received radiation in a spectral range of infrared radiation, said array comprising:

(a) a plurality of pixels formed in a layered structure; and (b) said layered structure including a substrate, circuit elements formed on said substrate, a conducting radiation reflecting layer insulated from and located on said circuit elements, said conducting layer acting as a ground plane and radiation reflector, a spacer layer located on said reflector layer, said spacer layer defining a well above said circuit elements, and said radiation variable resistors supported by said spacer layer and located above said well, wherein said resistors comprise a radiation absorbing material with a sheet resistance providing at least 50% absorption in said spectral range, and wherein the wavelengths of said spectral range of infrared radiation are 8–12 μm.

* * * * *